US007736197B2

(12) United States Patent
Takeda

(10) Patent No.: US 7,736,197 B2
(45) Date of Patent: Jun. 15, 2010

(54) CONNECTOR WITH RESTRICTING MEANS

(75) Inventor: Kazuaki Takeda, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 12/328,495

(22) Filed: Dec. 4, 2008

(65) Prior Publication Data

US 2009/0149057 A1 Jun. 11, 2009

(30) Foreign Application Priority Data

Dec. 10, 2007 (JP) ............................ 2007-318346

(51) Int. Cl.
*H01L 21/44* (2006.01)

(52) U.S. Cl. ..................... 439/680; 439/948; 439/924.1

(58) Field of Classification Search ................. 439/680, 439/948, 678, 378, 350, 732, 679
See application file for complete search history.

(56) References Cited

U.S. PATENT DOCUMENTS 4,179,179 A * 12/1979 Lowden ...................... 439/278
4,647,130 A * 3/1987 Blair et al. .................. 439/248
4,664,456 A * 5/1987 Blair et al. .................. 439/108
4,761,144 A * 8/1988 Hunt et al. .................. 439/545
4,815,983 A * 3/1989 Erickson et al. ............. 439/173
5,425,650 A 6/1995 Maeda
5,435,748 A * 7/1995 Abe ........................... 439/489
5,466,171 A * 11/1995 Bixler et al. ................ 439/378
5,607,327 A * 3/1997 Tsuji et al. .................. 439/752
5,620,329 A * 4/1997 Kidd et al. .................. 439/248
5,885,107 A * 3/1999 Sluss et al. .................. 439/595
6,022,237 A * 2/2000 Esh ............................ 439/348
6,155,857 A * 12/2000 Kato et al. .................. 439/248
D460,047 S * 7/2002 Ching ....................... D13/147
6,416,346 B1 7/2002 Nakamura
6,565,390 B2 * 5/2003 Wu ............................ 439/680
7,214,090 B2 5/2007 Aihara et al.
2008/0026622 A1 * 1/2008 Tomizu et al. .............. 439/247
2009/0104802 A1 * 4/2009 Percherke et al. ........... 439/153

* cited by examiner

*Primary Examiner*—Neil Abrams
*Assistant Examiner*—Harshad C Patel
(74) *Attorney, Agent, or Firm*—Gerald E. Hespos; Michael J. Porco

(57) ABSTRACT

A restriction (30) is provided for preventing a second housing (20) from being fit in an incorrect oblique posture into a receptacle (12). The restriction includes restricting ribs (31) projecting from an inner surface of the receptacle (12) and restricting grooves (32) formed by recessing an outer surface of the second housing (20). Each restricting rib (31) includes a first rib (31A) extending in a connecting direction and second ribs (31B) located behind the front end of the first rib (31A) in the connecting direction. Each restricting groove (32) includes a first groove (32A) extending in the connecting direction and second grooves (32B) located before the rear end of the first groove (32A) in the connecting direction.

15 Claims, 9 Drawing Sheets

CONNECTOR WITH RESTRICTING MEANS

BACKGROUND OF THE INVENTION

1. Field of the Invention

The invention relates to a connector.

2. Description of the Related Art

U.S. Pat. No. 7,214,090 discloses a connector with first and second housings. The first housing has a receptacle and the second housing is configured to fit in the receptacle. The connector also has a restriction for preventing the second housing from being fit in an incorrect posture. The restriction includes a rib formed on an inner surface of the receptacle and a groove formed in an outer surface of the second housing. The rib and the groove engage to permit a connecting operation of the housings when the second housing is fit into the receptacle in a correct posture. However, the outer surface of the second housing interferes with the rib to prevent connection if the second housing is in an incorrect posture.

The restricting rib of the above-described conventional connector projects substantially at right angles from a longer side of the receptacle and prevents the connecting operation when the second housing is inclined about an axis parallel to shorter sides of the receptacle. However, the connecting operation is not prevented when the receptacle is inclined about an axis parallel to the longer sides of the receptacle.

Ribs that project from both longer and shorter sides of the receptacle have been considered to address inclination about an axis parallel to the longer sides of the receptacle and inclination about an axis parallel to the shorter sides. However, with this structure, the posture of the second housing must be determined correctly in both a longer side direction and a shorter side direction at an initial stage of an operation of fitting the second housing into the receptacle. This complicates the connecting operation.

The invention was developed in view of the above situation, and an object thereof is to improve operability at an initial stage of a connecting operation in a connector designed to prevent a forced connection of housings.

SUMMARY OF THE INVENTION

The invention relates to a connector that has first and second housings. The first housing includes a receptacle with a back surface. One or more first terminal fittings project from the back surface and into the receptacle. The second housing accommodates one or more second terminal fittings that can fit in the receptacle and connect with the first terminal fittings. The second housing also has a restricting means for preventing the second housing from being fit in the receptacle in an incorrect oblique posture. The restricting means includes at least one restricting rib and at least one restricting groove. The restricting rib may project from an inner surface of the receptacle or an outer surface of the second housing. The restricting groove is formed by recessing the other of the inner surface of the receptacle and the outer surface of the second housing for engaging with the restricting rib only when the second housing is fit into the receptacle in a correct posture. The restricting rib may include a first rib extending substantially in a connecting direction and a second rib behind a front end of the first rib in the connecting direction. The restricting groove may include a first groove extending substantially in the connecting direction and a second groove before the rear end of the first groove in the connecting direction.

It is sufficient to adjust the posture of the second housing at an initial stage of a connecting operation so that the first rib and the first groove engage. Adjusting the posture of the second housing is easier and operability is better as compared with the case where the posture of the second housing is adjusted for simultaneously establishing the engagement of the first rib and the first groove and the engagement of the second rib and the second groove.

The connection of the housings progresses with the first rib and the first groove engaged. The posture of the second housing then is adjusted to engage the second rib and the second groove. However, at this time, the second housing already is fit in the receptacle and the posture of the second housing is substantially correct. Therefore, adjusting the posture of the second housing during the connecting operation is easy.

The second rib may project from the first rib, and the second groove may be recessed in the first groove. The shapes of these structures are simpler as compared with the case where the first and second ribs project independently and the first and second grooves are recessed independently.

The first rib preferably is a plate, and the second rib projects at substantially right angles from a plate of the first rib to reinforce the first rib.

The second rib and the second groove preferably engage each other before the front end surface of the second housing reaches the leading ends of the first terminal fittings. Thus, there is no likelihood that the first terminal fittings will collide with the front end surface of the second housing.

The first terminal fittings may include large first terminal fittings and small first terminal fittings that have thickness and width dimensions that are smaller than the corresponding dimensions of the large first terminal fittings. The small first terminal fittings preferably are adjacent to each other.

The restricting rib preferably projects from the inner surface of the receptacle, is connected with the back surface of the receptacle and/or faces an arrangement area of the small first terminal fittings.

The second housing needs to be positioned relative to the receptacle with high accuracy to connect the small first terminal fittings correctly with the female terminal fittings in the second housing. Accordingly, the restricting rib faces the arrangement area of the small first terminal fittings. Furthermore, the restricting rib is connected to the back surface of the receptacle to make deformation unlikely. In this way, engagement of the restricting rib and the restricting groove accurately positions the second housing in the receptacle.

A connection starting timing of the small first terminal fittings with mating second terminal fittings is later than a connection starting timing of the large first terminal fittings with mating second terminal fittings.

The first terminal fittings preferably are provided at two stages. The number of first terminal fittings at one stage is different from the number of first terminal fittings at the other stage. The restricting rib preferably is in a dead space formed because of the difference in number in the different levels.

These and other features of the invention will become more apparent upon reading the following detailed description of preferred embodiments and accompanying drawings.

DETAILED DESCRIPTION OF THE PREFERRED EMBODIMENTS

Figure 1:
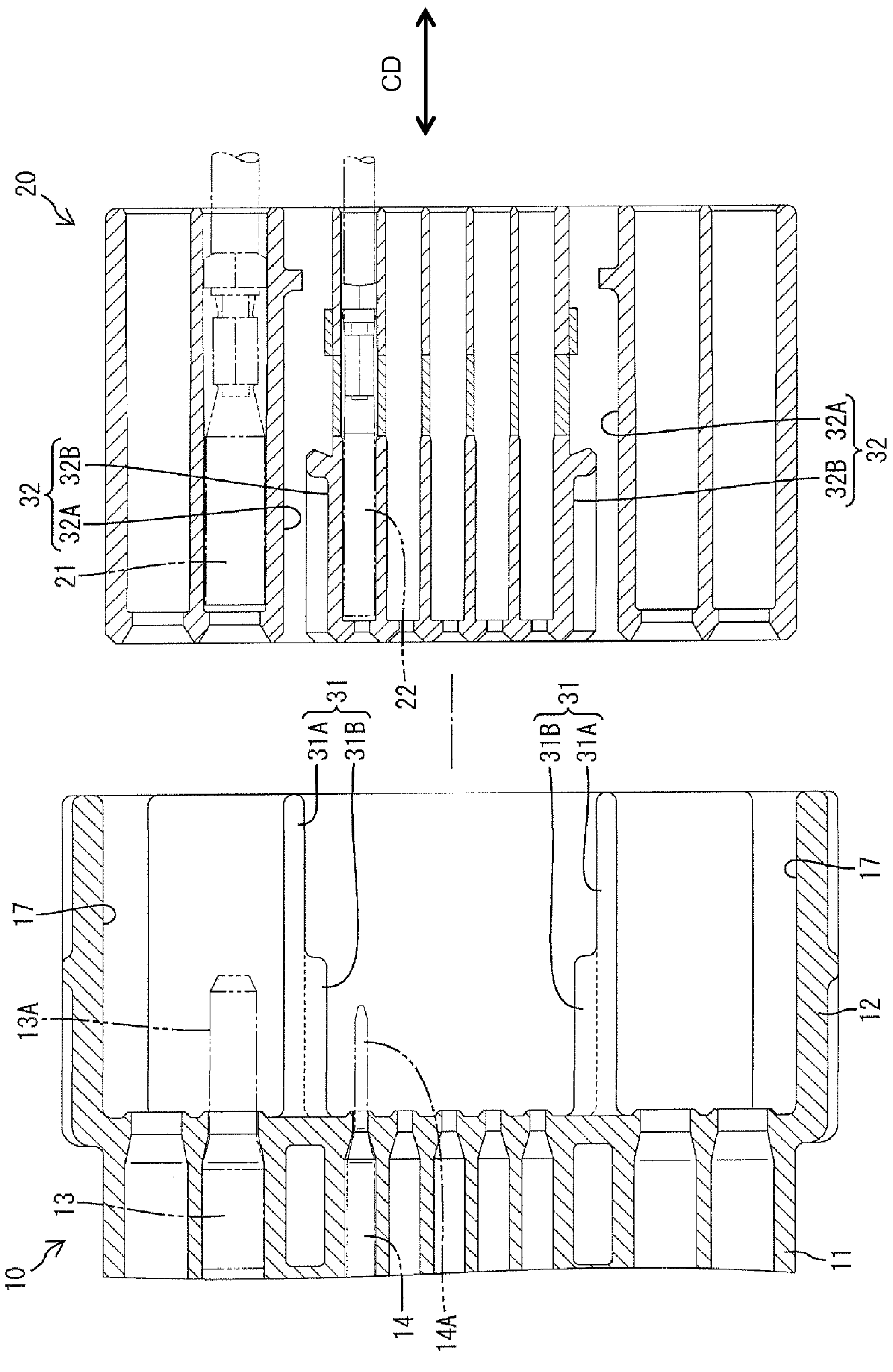
FIG. 1 is a horizontal section showing a state where a first housing and a second housing are separated in one embodiment.
Figure 2:
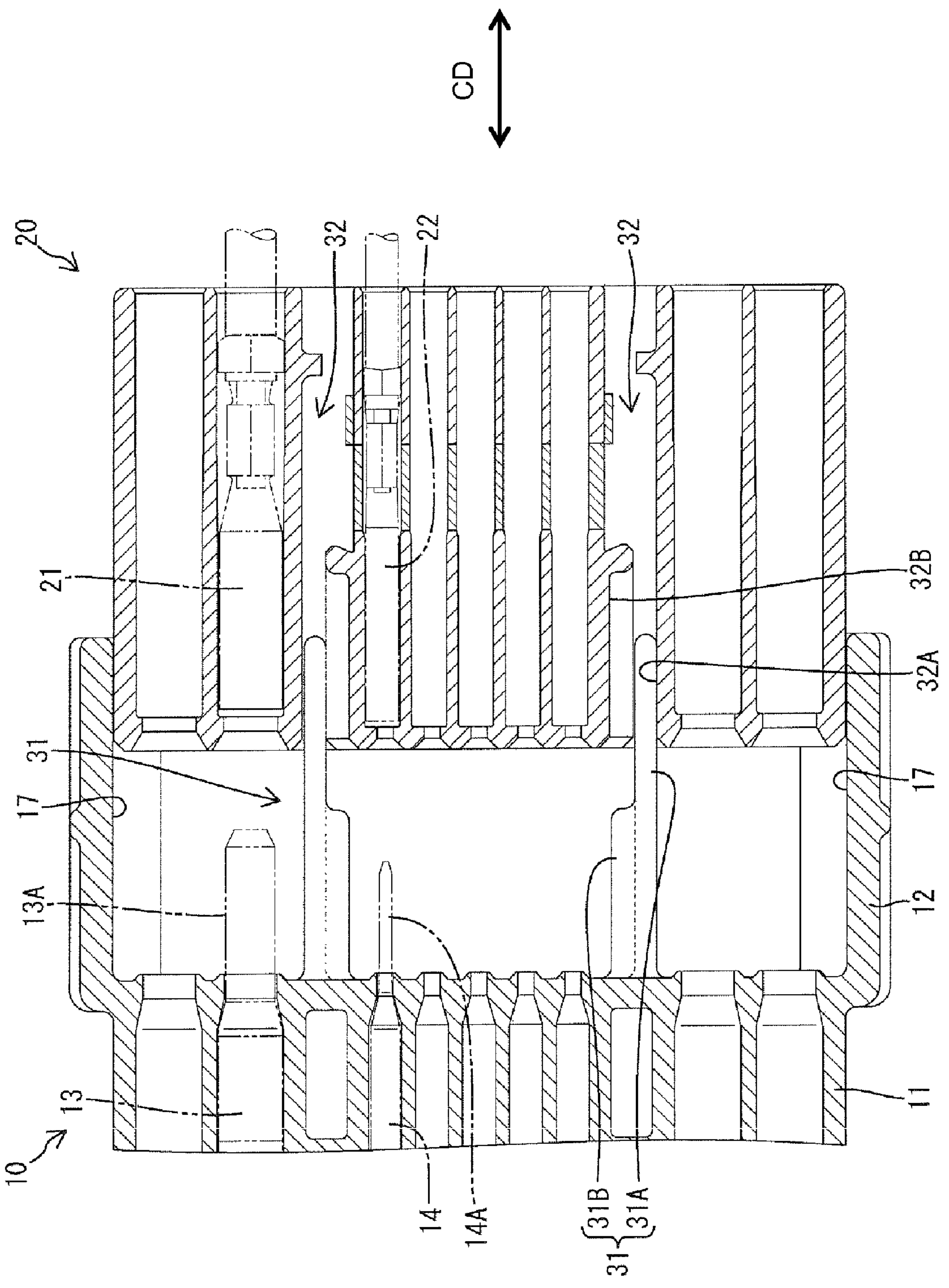
FIG. 2 is a horizontal section showing the process of connecting the first and second housings.
Figure 3:
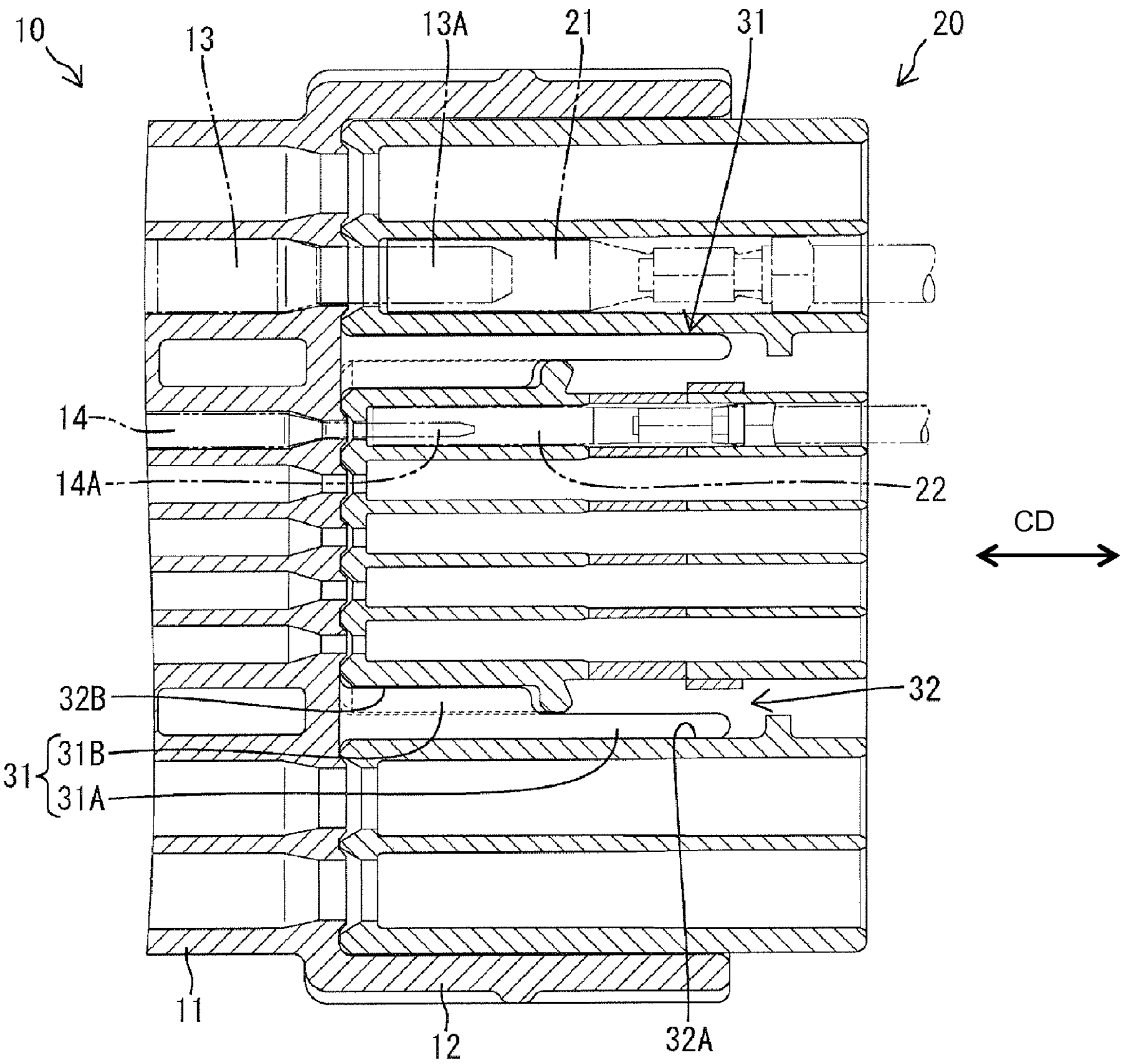
FIG. 3 is a horizontal section showing a state where the first and second housings are properly connected.

A connector in accordance with the invention is described with reference to FIGS. 1 to 9. The connector has a first housing 10 and a second housing 20 connectable with and separable from each other along the connecting direction CD. In the following description, connecting ends of the respective housings 10, 20 are referred to as front ends concerning forward and backward or connecting direction CD.

The first housing 10 is made unitarily e.g. of synthetic resin and has a wide block-shaped terminal accommodating portion 11 and a wide rectangular tubular receptacle 12 extends forward from the outer periphery of the terminal accommodating portion 11. Main bodies of large male terminal fittings 13 and small male terminal fittings 14 are accommodated in the terminal accommodating portion 11. Large tabs 13A at the front ends of the large male terminal fittings 13 and small tabs 14A at the front ends of the small male terminal fittings 14 project into the receptacle 12 from the front surface of the terminal accommodating portion 11.

Figure 5:
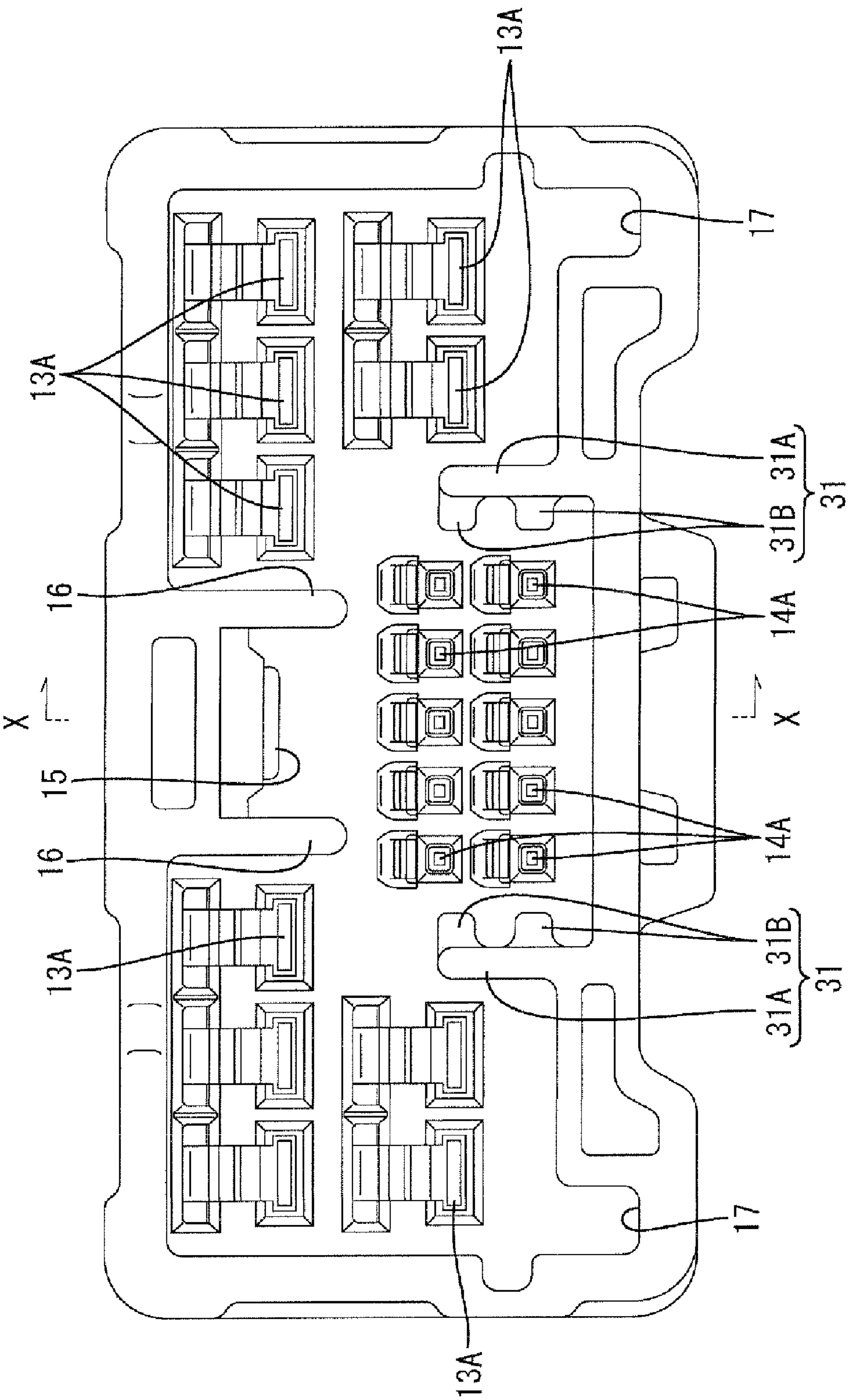
FIG. 5 is a front view of the first housing.
Figure 6:
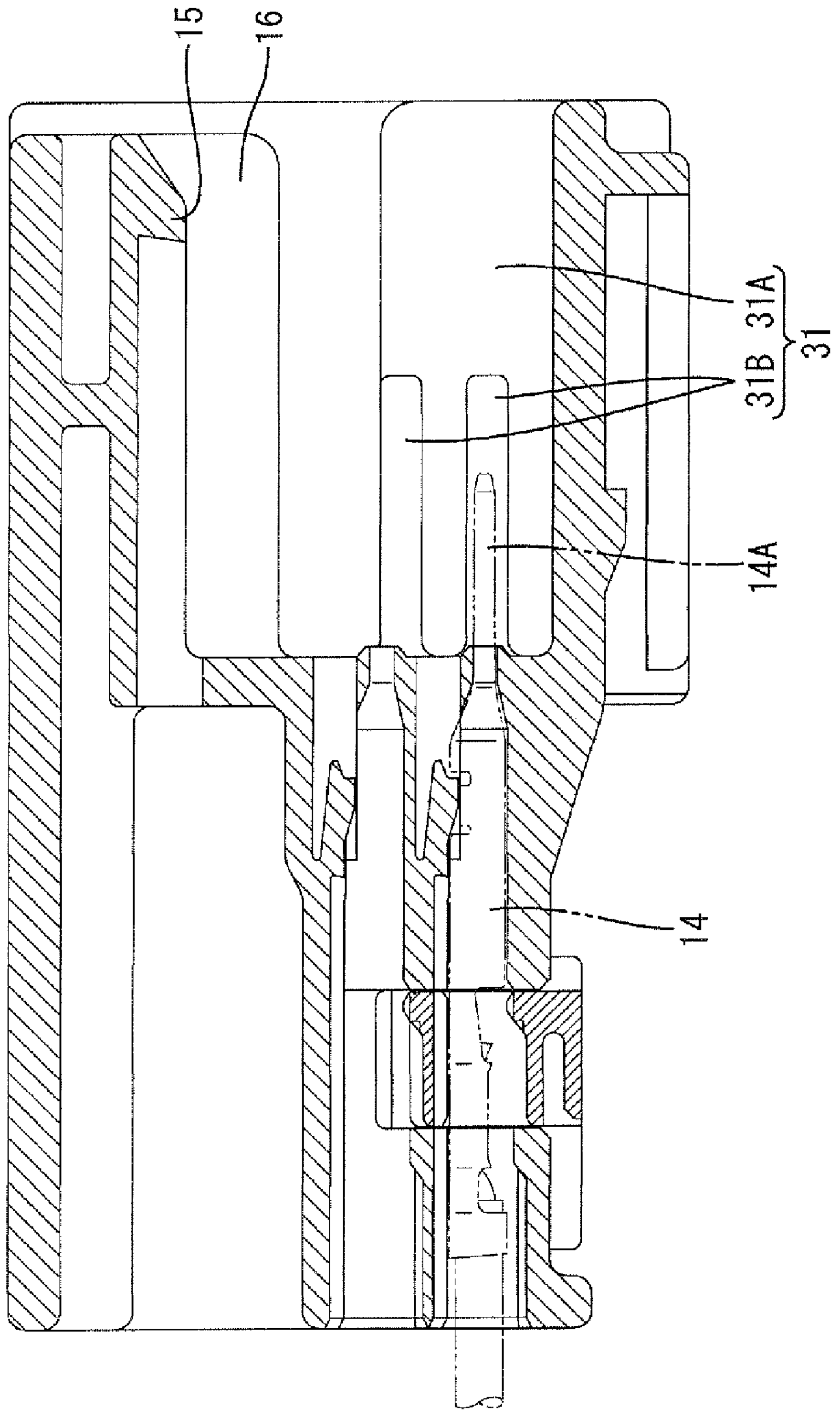
FIG. 6 is a section along X-X of FIG. 5.
Figure 7:
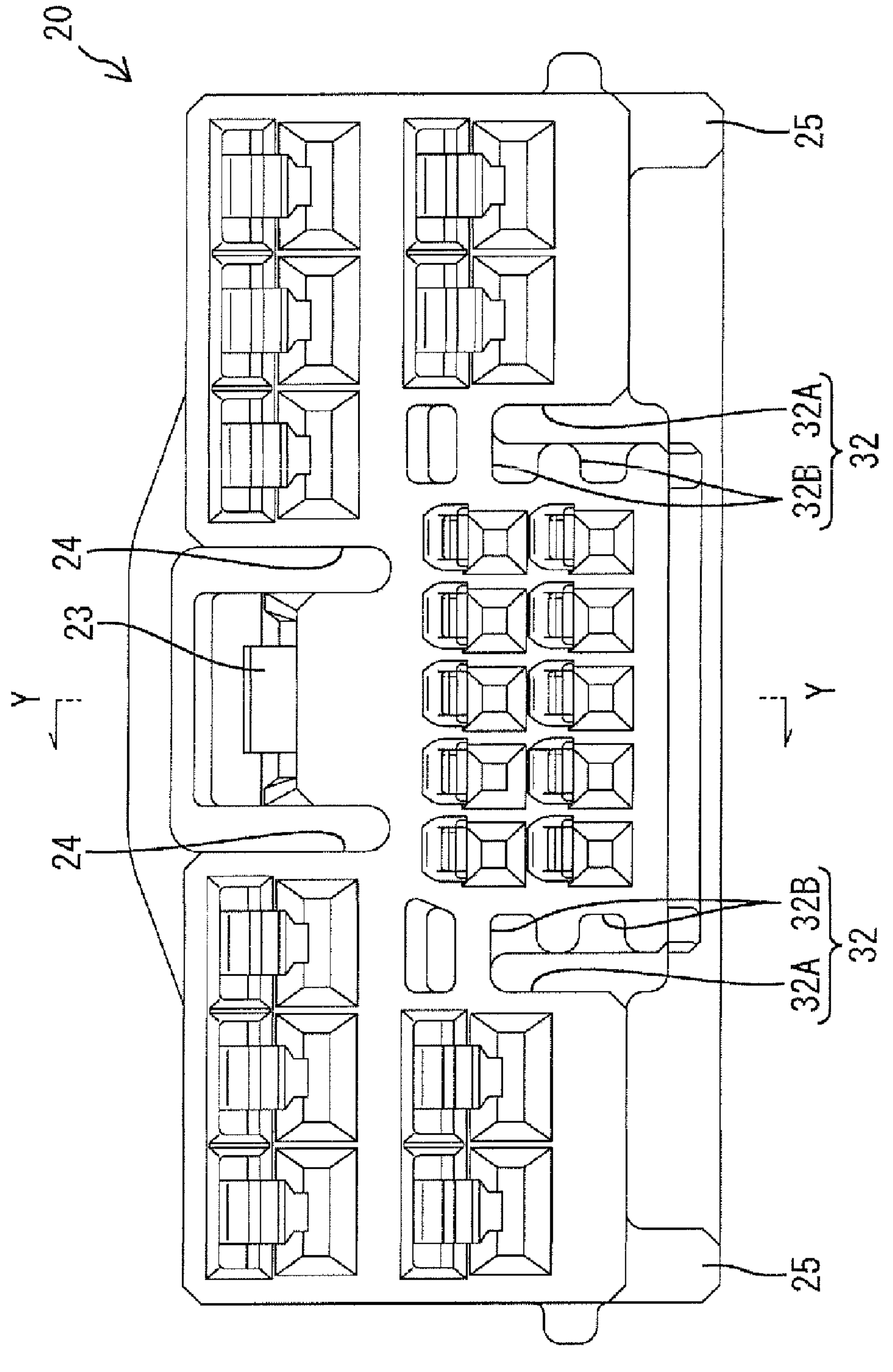
FIG. 7 is a front view of the second housing.
Figure 8:
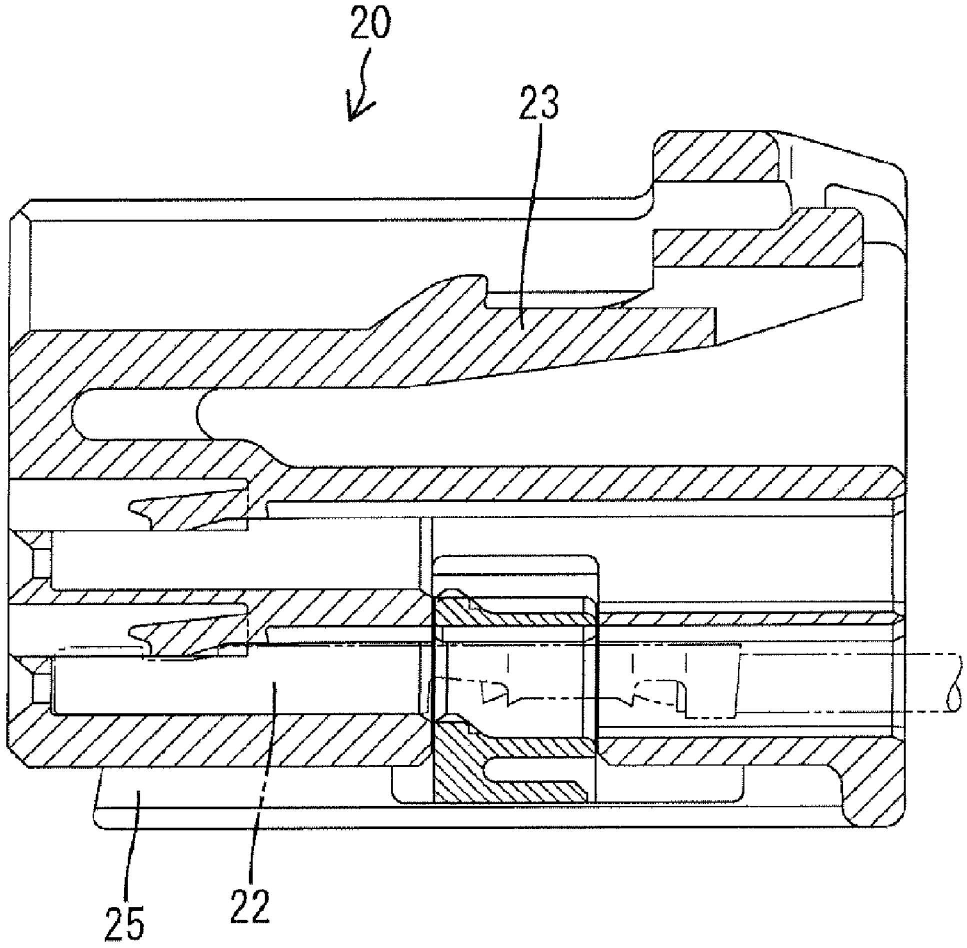
FIG. 8 is a section along Y-Y of FIG. 7.
Figure 9:
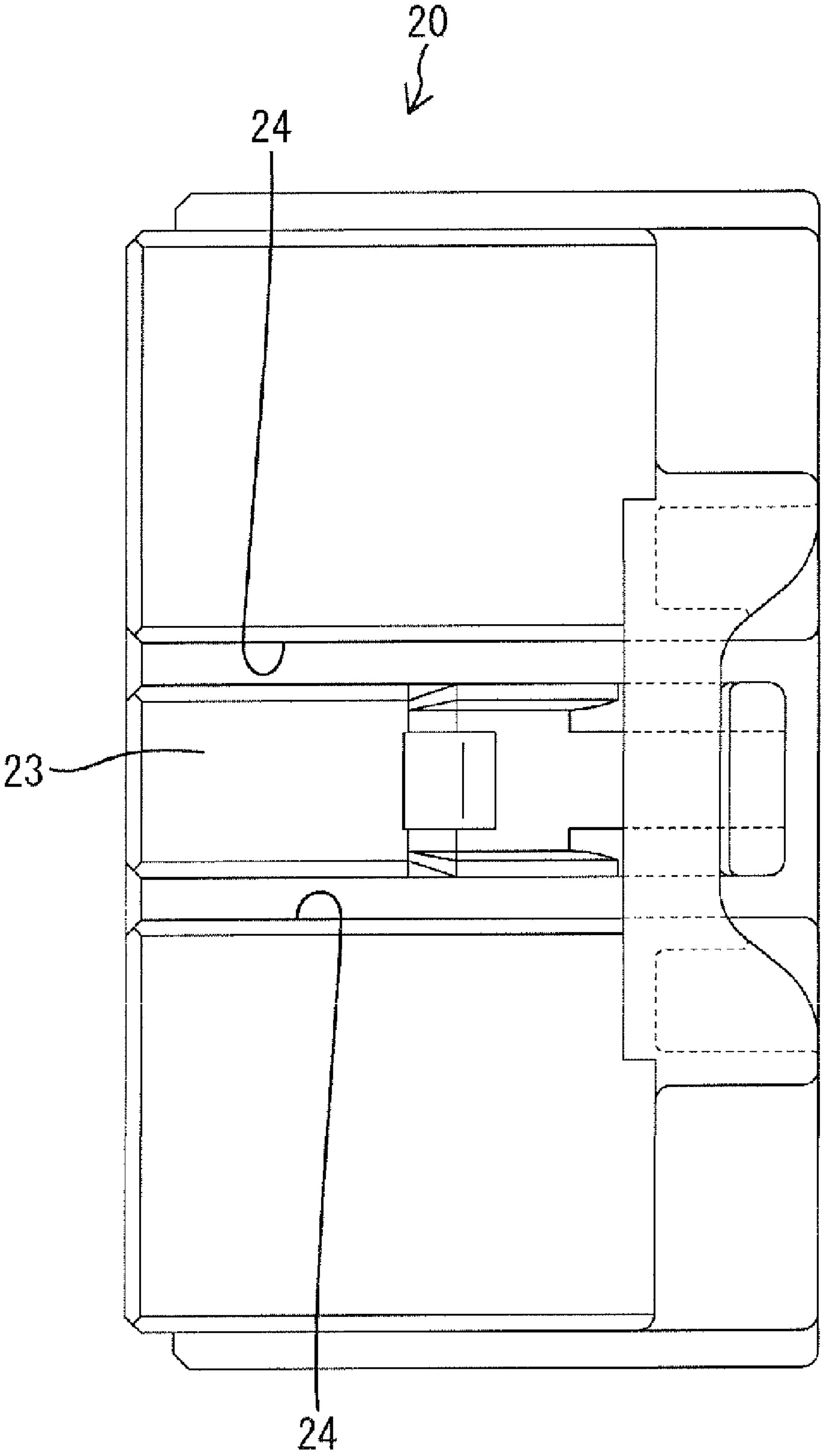
FIG. 9 is a plan view of the second housing.

The arrangement of the tabs 13A, 14A in the receptacle 12 is described with reference to FIG. 5. The large tabs 13A are oriented such that the thickness direction thereof is aligned substantially with the vertical direction and so that two tab groups are arranged laterally symmetrically at the left and right sides. The large tabs 13A of one tab group are arranged in upper and lower levels, with three large tabs 13 are arranged at specified intervals in a lateral direction in the upper level and two large tabs 13A arranged in the lower level at the same interval as the large-size tabs 13A. Two large tabs 13A in the upper level, excluding the one in a central part of the receptacle 12, are aligned substantially vertically with the two large tabs 13A in the lower level. A projecting distance of the respective large-size tabs 13A from the back end surface of the receptacle 12 is slightly less than half the depth of the receptacle 12, as shown in FIG. 1.

The small tabs 14A have substantially square cross-sections, and the thickness and width of the small tabs 14A in directions orthogonal to a connecting direction CD of the housings 10, 20 are smaller than the thickness and width dimensions of the large tabs 13A. The small tabs 14A are arranged in upper and lower levels to form one tab group in the lateral center of the receptacle 12 between the left and right groups of the large tabs 13A. The small tabs 14A are below the large tabs 13A in the upper level and overlap with the large tabs 13A in the lower level. A projecting distance of the respective small tabs 14A from the back end surface of the receptacle 12 is slightly shorter than the projecting distance of the large tabs 13A. Thus, a connection starting timing of the small tabs 14A is later than a connection starting timing of the large tabs 13A in the process of connecting the two housings 10, 20.

A lock 15 projects from the lower surface of the upper wall of the receptacle 12 at a substantially lateral center position. Two substantially plate-like first auxiliary ribs 16 project down and in from the top wall of the receptacle 12 at laterally symmetrical positions on opposite left and right sides of the lock 15. The first auxiliary ribs 16 extend continuously from the front opening end of the receptacle 12 and are aligned substantially parallel with the connecting direction CD of the housings 10, 20. The rear ends of the first auxiliary ribs 16 are connected with the back end surface of the receptacle 12. The first auxiliary ribs 16 are arranged laterally between the two groups of the large tabs 13A and above the group of the small tabs 14A in the vertical direction. The bottom ends of the first auxiliary ribs 16 are lower than the large tabs 13A in the upper level. Two substantially laterally symmetrical second auxiliary grooves 17 are formed at opposite left and right ends of the bottom wall of the receptacle 12. The second auxiliary grooves 17 extend continuously from the opening end of the receptacle 12 substantially parallel with the connecting direction CD of the housings 10, 20, and the rear ends of the second auxiliary grooves 17 reach the back end surface of the receptacle 12.

Figure 4:
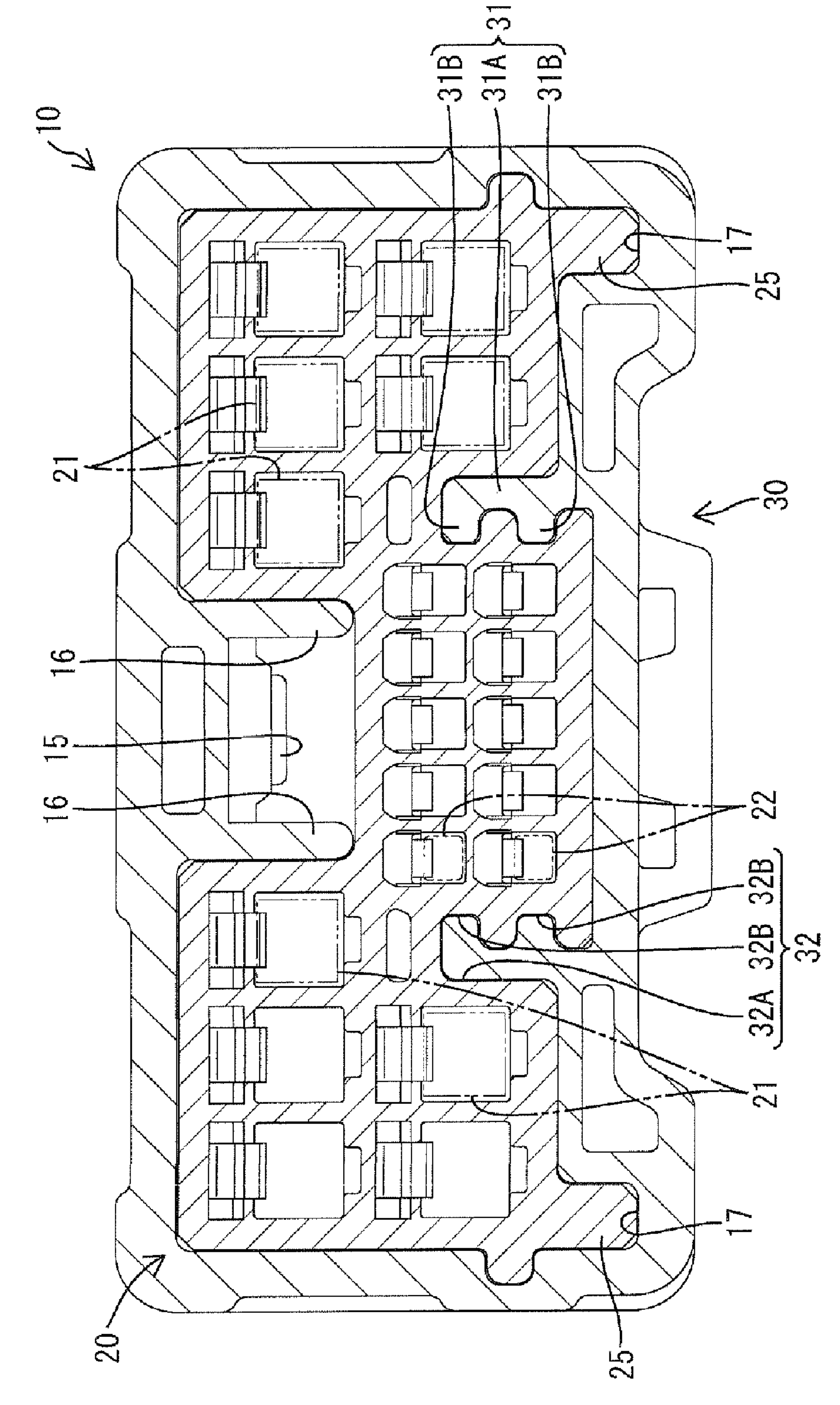
FIG. 4 is a horizontal section showing an engaged state of restricting ribs and restricting grooves with the first and second housings connected.

The second housing 20 is a wide block configured to fit into the receptacle 12. As shown in FIG. 4, five large female terminal fittings 21 are arranged at each of the left and right sides of the second housing 20 to correspond to the large tabs 13A of the first housing 10 and small female terminal fittings 22 are arranged in the lateral center of the second housing 20 to correspond to the small tabs 14 of the first housing 10.

A lock arm 23 is formed at a lateral center position of the top surface of the second housing 20. The lock arm 23 is vertically resiliently deformable in a direction intersecting the connection direction CD. The lock arm 23 interferes with the lock 15 to deform resiliently down and in toward the second housing 20 in the process of connecting the two housings 10, 20 and resiliently restores to engage the lock 15 when the housings 10, 20 reach a properly connected state.

The outer top surface of the second housing 20 is recessed at the opposite left and right sides of the lock arm 23 to form two laterally symmetrical first auxiliary grooves 24. The first auxiliary grooves 24 extend continuously from the front end surface to the rear end surface of the second housing 20 and are aligned substantially parallel with the connecting direction CD of the housings 10, 20. The first auxiliary ribs 16 and the first auxiliary grooves 24 engage in the process of connecting the two housings 10, 20 in proper postures to keep the housings 10, 20 in proper postures and to prevent forced connection between the housings 10, 20. Two laterally symmetrical second auxiliary ribs 25 are formed at the opposite left and right ends of the bottom surface of the second housing 20. The second auxiliary ribs 25 extend continuously from the front end surface to the rear end surface of the second housing 20 and are aligned substantially parallel with the connecting direction CD of the housings 10, 20. The second auxiliary ribs 25 and the second auxiliary grooves 17 engage in the process of connecting the housings 10, 20 in proper postures to keep the two housings 10, 20 in the proper postures and to prevent forced connection between the two housings 10, 20.

The connector further includes a restricting means 30. The restricting means 30 includes two restricting ribs 31 formed on the inner surface of the receptacle 12 and two substantially laterally symmetrical restricting grooves formed in the outer surface of the second housing 20.

The restricting ribs 31 are plates that extend substantially perpendicularly up and in from the inner surface of the bottom wall of the receptacle 12. Each restricting rib 31 is in a lateral position between the corresponding tab group of the large tabs 13A and the tab group of the small tabs 14A. More particularly, each restricting rib 31 is substantially right below the large tab 13A located at the central side of the receptacle 12 out of the three large tabs in the upper level. Thus, the restricting ribs 31 are in dead spaces formed because there are fewer of the large tabs 13A in the lower level than in the upper level. The upper ends of the restricting ribs 31 are below the large tabs 13A in the upper level and slightly below the upper end of the formation range of the tab group of the small tabs 14A. More specifically, the upper ends of the restricting ribs 31 are substantially at the same height as the large tabs 13A in the lower level and the small-size tabs 14A in the upper level. Hence, the vertical formation range of the restricting ribs 31 is sufficiently extensive to correspond to the formation area of the small tabs 14A.

Each restricting rib 31 has a first rib 31A and two second ribs 31B. The first rib 31A is connected directly with the bottom wall of the receptacle 12 and extends up at substantially right angles from the bottom wall. A projecting distance of the first rib 31A from the bottom wall of the receptacle 21 is considerably longer than the thickness of the first rib 31A (preferably, the projecting distance is more than twice the width thereof, more preferably at least three times the width thereof). Accordingly, the first rib 31A is a plate aligned at substantially right angles to the bottom wall of the receptacle 12. The first rib 31A extends substantially parallel with the connecting direction CD of the two housings 10, 20, and a formation area of each first rib 31A in forward and backward directions is a continuous range from the opening end of the receptacle 12 at the front of the first housing 10 to the back end surface of the receptacle 12. The rear end of each first rib 31A is connected with the back end surface of the receptacle 12. The first ribs 31A are more laterally outward than the first auxiliary ribs 16 and the upper ends of the first ribs 31A are the upper ends of the restricting ribs 31.

The second ribs 31B project substantially normally from the inner side surface of each of the first ribs 31A and are substantially parallel with the bottom wall of the receptacle 12. The second ribs 31B are at vertically spaced positions on the respective first rib 31A near a substantially vertical center position of the first rib 31A. The upper surface of the upper second rib 31B is substantially continuous and flush with the upper surface of the first rib 31A. A projecting distance of the second ribs 31B from the first rib 31A is substantially equal to the vertical dimension of the second ribs 31B.

The second ribs 31B extend in forward and backward directions substantially parallel with the connecting direction CD of the housings 10, 20, and thus are similar to the first ribs 31A. However, a formation area of the second ribs 31B differs from that of the first ribs 31A. Specifically, the second ribs 31B are formed continuously in a range from a position behind the opening end of the receptacle 12 at the front of the first housing 10 to the back end surface of the receptacle 12. Additionally, the rear ends of the second ribs 31B are connected with the back end surface of the receptacle 12. A dimension of the second ribs 31B in the forward and backward directions preferably is less than about ⅔ of the length of the first ribs 31A, more preferably substantially half the length of the first ribs 31A. Furthermore, the front ends of the second ribs 31B are slightly before the front ends of the small tabs 14A. This formation area in forward and backward directions is the same for the upper second ribs 31B and the lower second ribs 31B.

The restricting grooves 32 extend up and in at substantially right angles from the bottom surface of the second housing 20. Each restricting groove 32 is in a lateral position between the corresponding left and right formation areas of the large female terminal fittings 21 and the formation area of the small female terminal fittings 22. Additionally, each restricting groove 32 is right below the large female terminal fitting 21 of the upper level that is closest to the center of the second housing 20. Thus, the restricting grooves 32 are arranged in dead spaces because the number of the large female terminal fittings 21 in the lower level is less than in the upper level. The upper ends of the restricting grooves 32 in the vertical direction are below the large female terminal fittings 21 in the upper level and slightly below the upper end of the formation range of the small female terminal fittings 22. Specifically, the upper ends of the restricting grooves 32 are heights to at least partly overlap with the large female terminal fittings 21 in the lower level and the small female terminal fittings in the upper level.

Each restricting groove 32 is comprised of one first groove 32A and two second grooves 32B. The first groove 32A is formed in the bottom surface of the second housing 20. The depth of the first groove 32A from the bottom surface of the second housing 20 is considerably larger than the width thereof (preferably is more than twice the width thereof, more preferably at least three times the width thereof). Accordingly the first groove 32A is a slit at substantially right angles to the bottom surface of the second housing 20. The first groove 32A extends substantially parallel with the connecting direction CD of the two housings 10, 20 from the opening end of the second housing 20 to a position close to the rear end. Additionally, the two first grooves 32A are located more laterally out than the pair of first auxiliary grooves 24. The upper ends of the first grooves 32A are the upper ends of the restricting grooves 32.

The second grooves 32B project substantially normal to the first grooves 32A and are aligned substantially parallel with the bottom surface of the second housing 20 from one side surface of the each first groove 32A, i.e. at an inner surface near the lateral center of the second housing 20. The two second grooves 32B are arranged at the upper end of the first groove 32A and at a substantially vertical center of the first groove 32A while being vertically spaced apart. The upper surface of the upper second groove 32B is substantially continuous and flush with the upper surface of the first groove 32A. An extending distance of the second grooves 32B from the first groove 32A substantially equals the vertical dimension of the second grooves 32B.

The second grooves 32B extend substantially parallel with the connecting direction CD of the two housings 10, 20, similar to the first grooves 32A. However, a formation area of the second grooves 32B in forward and backward directions differs from the formation area of the first grooves 32A. Specifically, the second grooves 32B are formed continuously in a range from the front end surface of the second housing 20 to a position before the rear ends of the first grooves 32A. A dimension of the second grooves 32B in the forward and backward directions preferably is less than about ⅔ of the length of the first grooves 32A, and most preferably substantially half the length of the first grooves 32A. This formation area in forward and backward directions is the same for the upper second grooves 32B and the lower second grooves 32B.

The two housings 10, 20 are connected by fitting the second housing 20 into the receptacle 12 along the connecting direction CD. At this time, the front end surface of the second housing 20 will interfere with the front ends of the restricting ribs 31, if the second housing 20 is in an incorrect oblique posture relative to the receptacle 12 (or if the longitudinal axis thereof is inclined with respect to the connecting direction CD). Therefore the obliquely aligned second housing 20 cannot be connected. Thus, the second housing 20 can be fit into the receptacle 12 if the posture of the second housing 20 is adjusted to be right opposed to the first housing 10.

The first ribs 31A and the first grooves 32A are engaged first in the restricting means 30 when the connecting operation is started. Simultaneously, the first auxiliary ribs 16 and the first auxiliary grooves 24 engage and the second auxiliary ribs 25 and the second auxiliary grooves 17 engage. These engagement actions prevent the second housing 20 from inclining a large amount to the left or the right about a vertical axis parallel to the shorter sides of the receptacle 12 and keeps the second housing 20 in a substantially correct posture relative to the receptacle 12. In this way, the connecting operation of the two housings 10, 20 progresses smoothly without forcibly fitting the second housing 20 into the receptacle 12.

The engagement of the second ribs 31B and the second grooves 32B starts when the connecting operation of the two housings 10, 20 progresses sufficiently for the front end of the second housing 20 to reach the front ends of the second ribs 31B. This engagement action prevents the second housing 20 from being vertically inclined a large amount about a lateral axis parallel with the longer sides of the receptacle 12 and keeps the second housing 20 in the correct posture relative to the receptacle 12. In this way, forced connection of the second housing 20 and the receptacle 12 is prevented more effectively and the connecting operation of the housings 10, 20 progresses without hindrance.

The two housings 10, 20 are connected further after the engagement of the second ribs 31B and the second grooves 32B is started. Thus, the large tabs 13A start entering the second housing 30 immediately after the second ribs 31B start engaging the second grooves 32B. The engagement action of the first ribs 31A and the first grooves 32A and the engagement action of the second ribs 31B and the second grooves 32B position the second housing 20 with high accuracy relative to the receptacle 12 with respect to the vertical and lateral directions when the large tabs 13A enter the second housing 20. Thus, the large tabs 13A enter the second housing 20 without interfering with the front end surface of the second housing 20 and are connected with the large female terminal fittings 21.

The two housings 10, 20 are connected further in this state so that the small tabs 14A start entering the second housing 20. At this time, the engagement action of the first ribs 31A and the first grooves 32A and the engagement action of the second ribs 31B and the second grooves 32B positions the second housing 20 with high accuracy relative to the receptacle 12 with respect to the vertical and lateral directions. Thus, the small tabs 14A enter the second housing 20 without interfering with the front end surface of the second housing 20 and are connected with the small female terminal fittings 22.

According to this embodiment, it is sufficient to adjust the posture of the second housing 20 so that the first ribs 31A and the first grooves 32A are engaged at an initial stage of the connecting operation of the two housings 10, 20. Thus, the operation of adjusting the posture of the second housing 20 is easier and operability is better as compared with the case where the posture of the second housing 20 is adjusted to simultaneously establish the engagement of the first ribs and the first grooves 32A and the engagement of the second ribs 31B and the second grooves 32B.

The posture of the second housing 20 is adjusted to engage the second ribs 31B and the second grooves 32B after the connecting operation of the two housings 10, 20 progresses sufficiently for the first ribs 31A to engage the first grooves 32A. At this point of time, the second housing 20 already is fit into the receptacle 12 and is substantially in the correct posture. Therefore the operation of the adjusting the posture of the second housing 20 during the connecting operation is also easy.

The second ribs 31B project from the first ribs 31A and the second grooves 32B are formed by recessing the inner surfaces of the first grooves 32A. Thus, the shapes of the restricting ribs 31 and the restricting grooves 32 are simpler as compared with the case where the first ribs 31A and the second ribs 31B project independently of each other and the first grooves 32A and the second grooves 32B are formed independently of each other.

The first ribs 31A are in the form of projecting plates and the second ribs 31B project substantially at right angles from the plate surfaces of the first ribs 31A. Thus, the second ribs 31B fulfill a function of reinforcing the plate-like first ribs 31A.

The posture of the second housing 20 relative to the receptacle 12 is adjusted substantially correctly by the engagement of the first ribs 31A and the first grooves 32A and the engagement of the second ribs 31B and the second grooves 32B before the front end surface of the second housing 20 reaches the leading ends of the large tabs 13A and the small tabs 14A in the receptacle 12. Thus, there is no likelihood that the large tabs 13A and the small tabs 14A collide with the front end surface of the second housing 20.

The small tabs 14A in the receptacle 12 have a small size. Thus, the second housing 20 needs to be positioned relative to the receptacle 12 with high accuracy to correctly connect the small-size tabs 14A with the female terminal fittings in the second housing 20. Accordingly, the restricting ribs 31 project from the inner surface of the receptacle 12 and are arranged to face the arrangement area of the small tabs 14A in the vicinity of the arrangement area of the small-size tabs 14A while being made difficult to deform by being connected with the back end surface of the receptacle 12. In this way, the second housing 20 can be positioned relative to the receptacle 12 with high accuracy by the engagement of the restricting ribs 31 and the restricting grooves 32.

The invention is not limited to the above described and illustrated embodiment. For example, the following embodiments are also embraced by the technical scope of the present invention.

The first ribs are formed over the range corresponding to the formation range of the second ribs in the connecting direction in the above embodiment. However, the formation range of the first ribs in the connecting direction may be limited to a range before that of the second ribs.

The inclining direction of the posture of the second housing restricted by the first ribs and the one restricted by the second ribs are substantially orthogonal to each other in the above embodiment. However, the restricting direction by the first ribs and the one by the second ribs may be the same direction or oblique to each other.

The first ribs extend back from the opening edge of the receptacle in the above embodiment. However, they may extend back from positions behind the opening edge of the receptacle.

The second ribs project from the plate surfaces of the first ribs in the above embodiment. However, they may project independently at positions of the inner surface of the receptacle different from the first ribs. In this case, the first and second grooves are formed independently by recessing the outer surface of the second housing at mutually different positions.

The first ribs are in the form of projecting plates whose projecting distance is considerably longer than the width. However, the first ribs may have a projecting distance shorter than the width or the width and the projecting distance may be substantially equal.

The second ribs and the second grooves are engaged before the front end surface of the second housing reaches the leading ends of the tabs in the receptacle in the above embodiment. However, the second ribs and the second grooves may be engaged after the front end surface of the second housing reaches the leading ends of the tabs in the receptacle.

Although two second ribs are formed on one first rib in the above embodiment, the number of the second ribs formed on one first rib may be one, three or more.

Although two pairs of restricting ribs and restricting grooves are provided in the above embodiment, the number of pairs of restricting ribs and restricting grooves may be one, three or more.

The second ribs are formed on the inner surfaces of a pair of first ribs facing each other in the above embodiment. However, the second ribs may be formed on the outer surfaces of the first ribs according to the invention.

The rear ends of the first ribs are connected with the back end surface of the receptacle in the above embodiment. However, they may not be connected with the back end surface of the receptacle.

The rear ends of the second ribs are connected with the back end surface of the receptacle in the above embodiment. However, they may not be connected with the back surface of the receptacle according to the invention.

The restricting ribs are formed on the inner surface of the receptacle and the restricting grooves are formed in the outer surface of the second housing in the above embodiment. However, the restricting ribs may be formed on the outer surface of the second housing and the restricting grooves may be formed in the inner surface of the receptacle according to the present invention.

What is claimed is:

1. A connector, comprising:

a first housing including a receptacle with an open end and a back surface, at least one first terminal fitting (13; 14) projecting from the back surface;

a second housing configured to fit in the receptacle and accommodating at least one second terminal fitting connectable with the first terminal fitting; and restricting means for preventing the second housing from being fit in an incorrect oblique posture into the receptacle, the restricting means including at least one restricting rib projecting from one of an inner surface of the receptacle and an outer surface of the second housing and at least one restricting groove formed by recessing the other of the inner surface of the receptacle and the outer surface of the second housing, the restricting groove being disposed and configured to engage with the restricting rib only when the second housing is fit into the receptacle in a correct posture, the restricting rib including a first rib extending substantially in a connecting direction and at least one second rib located behind a front end of the first rib in the connecting direction, and the restricting groove including a first groove extending substantially in the connecting direction and at least one second groove located before a rear end of the first groove in the connecting direction.

2. The connector of claim 1, wherein the at least one second rib projects from the first rib, and the at least one second groove is formed by recessing an inner surface of the first groove.

3. The connector of claim 2, wherein the first rib is a plate, and the second rib projects substantially at right angles from a plate surface of the first rib.

4. The connector of claim 1, wherein the second rib and the second groove are engageable with each other before the front end surface of the second housing reaches a leading end of the first terminal fitting in the process of fitting the second housing into the receptacle.

5. The connector of claim 1, wherein the at least one first terminal fitting includes large first terminal fittings and small first terminal fittings, the small first terminal fittings having thickness and width dimensions in directions orthogonal to the connecting direction of the first and second housings that are smaller than thickness and width dimensions of the large first terminal fittings.

6. The connector of claim 5, wherein the restricting rib projects from the inner surface of the receptacle and faces an arrangement area of the small first terminal fittings.

7. The connector of claim 5, wherein the small first terminal fittings are disposed so that, in the process of connecting the two housings, a connection of the small first terminal fittings with the second terminal fittings starts later than a connection of the large first terminal fittings with mating second terminal fittings.

8. The connector of claim 5, wherein the first terminal fittings are at first and second stages, with different numbers of the first terminal fittings at the first and second stages, the restricting rib being in a dead space in the stage having fewer of the first terminal fittings.

9. A connector, comprising:

a first housing with a receptacle having an open front end and a back surface, first terminal fittings projecting from the back surface;

a second housing configured to fit in the receptacle along a connecting direction and accommodating second terminal fittings connectable with the first terminal fittings;

at least one first rib formed in the receptacle and extending substantially in the connecting direction;

at least one second rib formed in the receptacle at a position behind a front end of the first rib in the connecting direction, the second rib extending substantially in the connecting direction and being aligned at an angle to the first rib;

a first groove in an outer surface of the second housing and extending in the connecting direction, the first groove engaging the first rib only when the second housing is fit in the receptacle in a substantially correct posture; and a second groove formed in an outer surface of the second housing before a rear end of the first groove and extending in the connecting direction, the second groove engaging the second restricting rib only when the second housing is fit into the receptacle in a correct posture.

10. The connector of claim 9, wherein the at least one second rib projects from the first rib, and the at least one second groove is formed by recessing an inner surface of the first groove.

11. The connector of claim 10, wherein the first rib is a plate, and the second rib projects substantially at right angles from a plate surface of the first rib.

12. The connector of claim 11, wherein the at least one second rib comprises at least two second ribs projecting from the first rib.

13. The connector of claim 9, wherein the second rib and the second groove are engageable with each other before a front end surface of the second housing reaches a leading end of the first terminal fitting in the process of fitting the second housing into the receptacle.

14. The connector of claim 9, wherein the at least one first terminal fitting includes large first terminal fittings and small first terminal fittings, the small first terminal fittings having thickness and width dimensions in directions orthogonal to the connecting direction of the first and second housings that are smaller than thickness and width dimensions of the large first terminal fittings, the first and second ribs facing an arrangement area of the small first terminal fittings.

15. The connector of claim 14, wherein the small first terminal fittings are disposed so that, in the process of connecting the two housings, a connection of the small first terminal fittings with the second terminal fittings starts later than a connection of the large first terminal fittings with mating second terminal fittings.

* * * * *